(12) United States Patent
Tsumuraya

(10) Patent No.: US 12,278,157 B2
(45) Date of Patent: Apr. 15, 2025

(54) HEAT RADIATOR AND ELECTRONIC COMPONENT MODULE

(71) Applicant: Molex, LLC, Lisle, IL (US)

(72) Inventor: Tetsunori Tsumuraya, Yamato (JP)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 18/269,768

(22) PCT Filed: Nov. 16, 2021

(86) PCT No.: PCT/IB2021/060579
§ 371 (c)(1),
(2) Date: Jun. 27, 2023

(87) PCT Pub. No.: WO2022/153107
PCT Pub. Date: Jul. 21, 2022

(65) Prior Publication Data
US 2024/0321671 A1 Sep. 26, 2024

(30) Foreign Application Priority Data

Jan. 12, 2021 (JP) .................................. 2021-002642

(51) Int. Cl.
*H01L 23/367* (2006.01)
*H01L 23/373* (2006.01)

(52) U.S. Cl.
CPC ...... *H01L 23/3672* (2013.01); *H01L 23/3735* (2013.01)

(58) Field of Classification Search
CPC ....... H05K 1/0201–0212; H05K 1/185; H05K 7/2028; H05K 3/301; H05K 3/429; H05K 3/4611; H05K 2201/0959; H05K 2201/10416; H01L 23/3672; H01L 23/367; H01L 23/3675; H01L 23/3735; H01L 23/5389; H01L 23/5226; H01L 2224/2402;
(Continued)

(56) References Cited

U.S. PATENT DOCUMENTS 3,646,572 A * 2/1972 Burr ........................ H05K 7/06
174/251
4,970,579 A 11/1990 Arldt et al.
(Continued)

FOREIGN PATENT DOCUMENTS

CN 206059386 U 3/2017
CN 111306515 A 6/2020
(Continued)

OTHER PUBLICATIONS

CN-113115510-A English Translation (Year: 2021).*
(Continued)

*Primary Examiner* — Amir A Jalali

(57) ABSTRACT

The invention comprises: a thermally conductive plate; and a resin coating integrated with the thermally conductive plate so as to cover at least a portion of the surface of the thermally conductive plate, wherein the resin coating includes a ventilation cylinder through which ventilation holes passing through the thermally conductive plate and the resin coating, and wherein at least a portion of the thermally conductive plate is housed inside a cylindrical wall of the ventilation cylinder.

9 Claims, 13 Drawing Sheets

(58) Field of Classification Search
CPC . H01L 2224/24141; H01L 2224/32267; H01L 2224/32227; H01L 2224/33519
See application file for complete search history.

(56) References Cited

U.S. PATENT DOCUMENTS

| | | | |
|---|---|---|---|
| 8,995,694 B2* | 3/2015 | Vos | B81C 1/0023 |
| | | | 381/174 |
| 9,329,646 B2 | 5/2016 | Chiriac et al. | |
| 2009/0114372 A1 | 5/2009 | Ippoushi et al. | |
| 2009/0175477 A1* | 7/2009 | Suzuki | H04R 19/04 |
| | | | 381/355 |
| 2017/0167714 A1 | 6/2017 | Hong | |
| 2018/0010775 A1 | 1/2018 | Sung | |
| 2020/0161199 A1* | 5/2020 | Tsuyutani | H01L 24/19 |
| 2023/0156903 A1* | 5/2023 | Teranishi | G06F 1/20 |
| | | | 361/704 |

FOREIGN PATENT DOCUMENTS

| | | | |
|---|---|---|---|
| CN | 113115510 A | * | 7/2021 |
| JP | 2002299700 A | | 10/2002 |
| JP | 2008098432 A | | 4/2008 |
| JP | 2008159995 A | | 7/2008 |
| JP | 2008306010 A | | 12/2008 |
| JP | 2013131748 A | | 7/2013 |
| JP | 2019102538 A | | 6/2019 |
| KR | 1020110050449 A | | 5/2011 |
| WO | 2010071290 A1 | | 6/2010 |

OTHER PUBLICATIONS

International Preliminary Report on Patentability received for PCT Application No. PCT/IB2021/060579, mailed on Jul. 27, 2023, 8 pages.
International Search Report and Written Opinion received for PCT Application No. PCT/IB2021/060579, mailed on Feb. 24, 2022, 6 pages.

* cited by examiner

HEAT RADIATOR AND ELECTRONIC COMPONENT MODULE

RELATED APPLICATIONS

This application is a U.S. National Phase Patent Application of International Patent Application No. PCT/IB2021/060579, filed on Nov. 16, 2021, which claims priority to Japanese Patent application no. 2021-002642, filed Jan. 12, 2021, and which are herein incorporated by reference in their entireties.

TECHNICAL FIELD

The present invention relates to a heat radiator and an electronic component module.

BACKGROUND ART

Conventionally, in electronic component modules on which a heat generating electronic component such as an LSI or an LED is mounted, a technique has been proposed in which a metal heat radiating plate having high thermal conductivity is disposed in order to radiate heat generated by the electronic component in addition to an electric circuit electrically connected to the electronic component (for example, see Patent Document 1).

FIG. 13 is a cross sectional view illustrating an electronic component module on which a conventional heat generating component is mounted.

In the drawing, 891 is a light emitting diode as a heat generating component mounted on an LED lighting apparatus, which is an electronic component module. Moreover, 811 is a substrate on the surface in which multiple light emitting diodes 891 are arranged and which is attached to the bottom plate of a resin case 831 of the LED lighting apparatus via a metal heat radiation fixing plate 861. Note that multiple heat radiating fins 861a are formed on the lower surface of the heat radiation fixing plate 861, such that the heat radiating fins 861a are embedded in the bottom plate of the resin case 831. Moreover, 832 is a translucent cover and is attached to the front surface of the resin case 831.

Further, a heat radiation cover 862 covering the upper surface of the substrate 811 is attached excluding the light emitting part of the light emitting diodes 891. The heat radiation cover 862 is made of metal and fixed so as to be in surface contact with the heat radiation fixing plate 861 around the substrate 811.

As a result, heat generated by the light emitting diodes 891 is effectively transmitted because it is transmitted to the heat radiation fixing plate 861 through two paths consisting of a path through the heat radiation cover 862 and a path through the substrate 811. Heat transmitted to the heat radiation fixing plate 861 in this manner is transmitted from the heat radiation fixing plate 861 and the heat radiating fin 861a to the bottom plate of the resin case 831 and is radiated from the outer surface of the resin case 831.

Prior Art Documents: Patent Documents: Patent Document 1 JP 2002-299700 A

SUMMARY

Unfortunately, in conventional electronic component modules, heat generated by the light emitting diodes 891 is radiated from the outer surface of the resin case 831 to the external environment. However, because the outer surface of the resin case 831 is flat, heat radiation to the external air is not necessarily sufficient, so the heat generated by the light emitting diodes 891 is readily confined therein. In recent years, improvements in heat radiation using high brightness light emitting diodes has been desired.

Here, the object of the present invention is to resolve the aforementioned conventional problems and provide a heat radiator and an electronic component module which have a simple configuration and high heat radiation, enabling effective heat radiation and preventing excessive temperature increases so as to increase reliability.

To this end, a heat radiator comprises: a thermally conductive plate; and a resin coating integrated with the thermally conductive plate so as to cover at least a portion of the surface of the thermally conductive plate, wherein the resin coating includes a ventilation cylinder through which ventilation holes passing through the thermally conductive plate and the resin coating, and wherein at least a portion of the thermally conductive plate is housed inside a cylindrical wall of the ventilation cylinder.

In another heat radiator, the thermally conductive plate further includes a cutting part and at least a portion of the cutting part is housed inside the cylindrical wall.

In yet another heat radiator, the thermally conductive plate further includes a ventilation corresponding opening which is a through hole generated by cutting the cutting part and is adjacent to the cutting part, with the ventilation hole passing through the ventilation corresponding opening.

In yet another heat radiator, the ventilation cylinder further extends upward and downward from the upper surface and lower surface of the resin coating.

In yet another heat radiator, at least a portion of the thermally conductive plate is further housed inside the cylindrical wall of the ventilation cylinder extending upward from the upper surface of the resin coating, with a slit shaped wall opening formed on the cylindrical wall of the ventilation cylinder extending downward from the lower surface of the resin coating.

An electronic component module comprises: a thermally conductive plate; a resin coating integrated with the thermally conductive plate so as to cover at least a portion of the surface of the thermally conductive plate; and an electronic component mounted on a flat mounting part of the thermally conductive plate, wherein the resin coating includes: a mounting recess formed such that the mounting part is exposed; and a ventilation cylinder through which ventilation holes passing through the thermally conductive plate and the resin coating, and wherein at least a portion of the thermally conductive plate is housed inside a cylindrical wall of the ventilation cylinder.

Another electronic component module further comprises a circuit board including a conductive path connected to the electronic component, wherein the resin coating houses the circuit board such that one end of the circuit board is connected to the mounting recess.

In yet another electronic component module, there are a plurality of ventilation cylinders disposed so as to surround at least a portion of the periphery of the mounting recess in a plan view.

In yet another electronic component module, the thermally conductive plate further includes a cutting part and the cutting part is formed such that a planar surface faces the mounting recess.

Effects of the Invention

According to the present disclosure, the heat radiator has a simple configuration and high heat radiation, enabling effective heat radiation and preventing excessive temperature increases so as to improve reliability.

DETAILED DESCRIPTION OF THE PREFERRED EMBODIMENTS

Embodiments of the present disclosure will be described in detail below with reference to the drawings.

Figure 1:
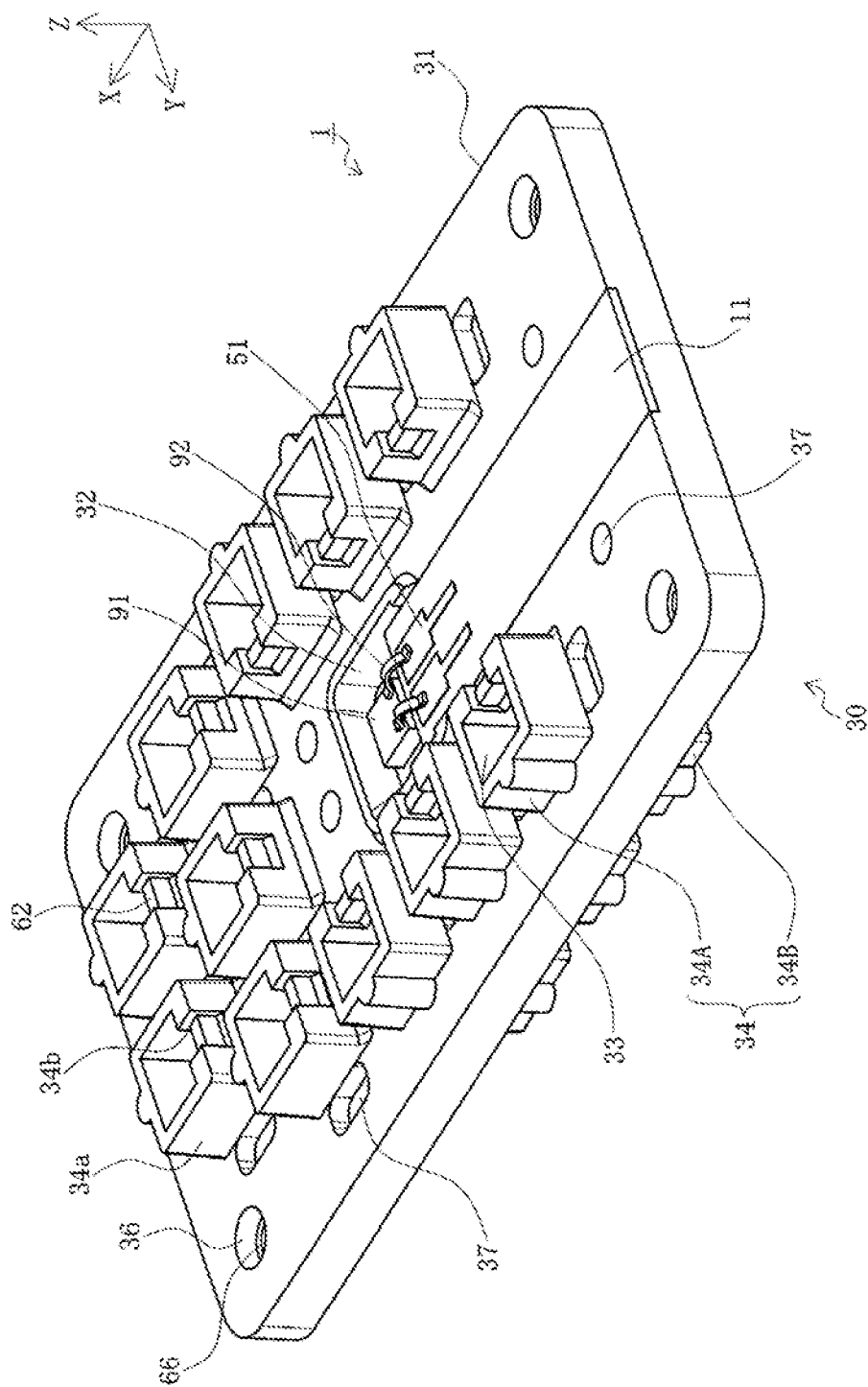
FIG. 1 is a perspective view as seen from the upper surface side of an electronic component module according to the present embodiment.
Figure 2:
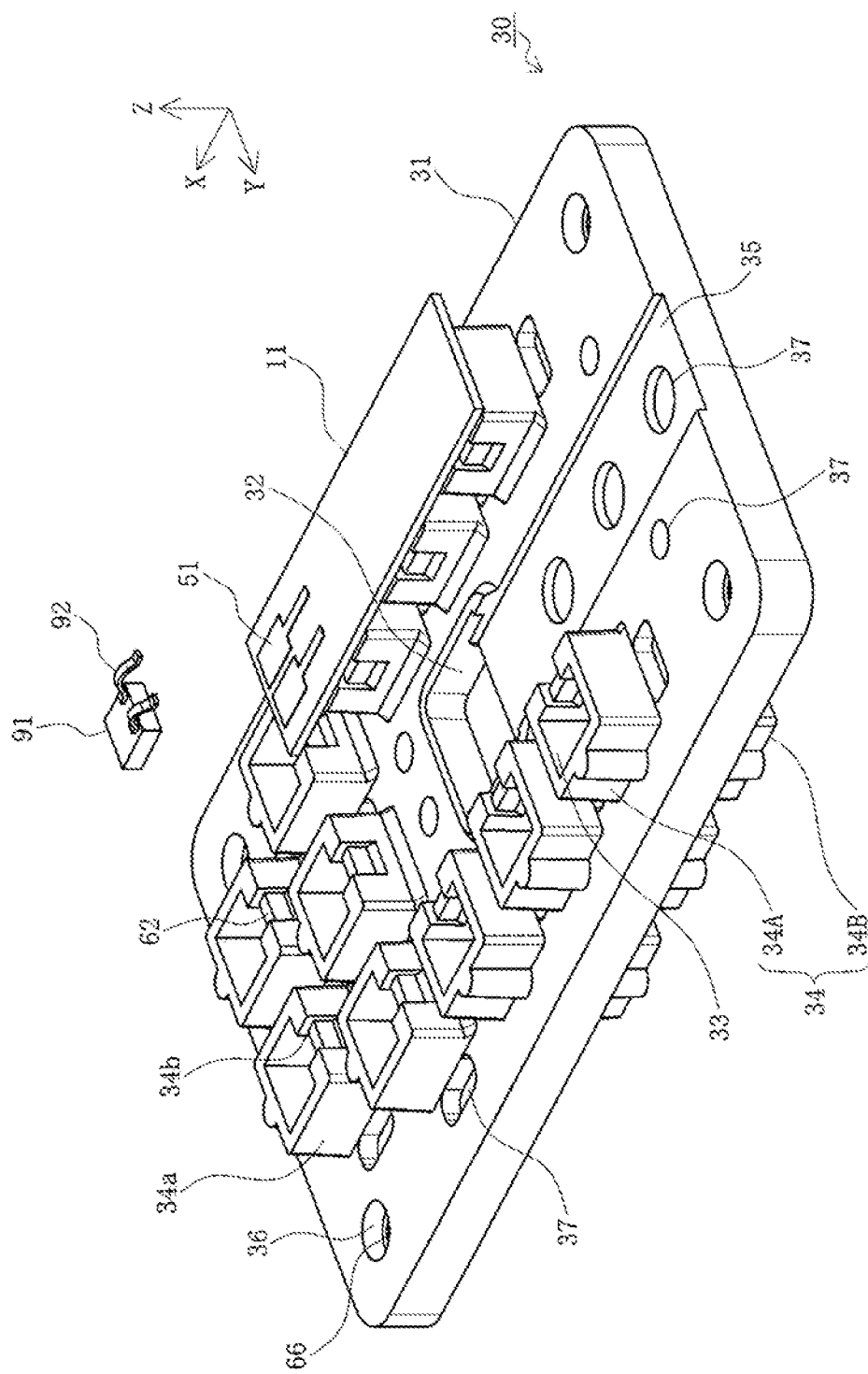
FIG. 2 is an exploded view of the electronic component module according to the present embodiment.
Figure 3:
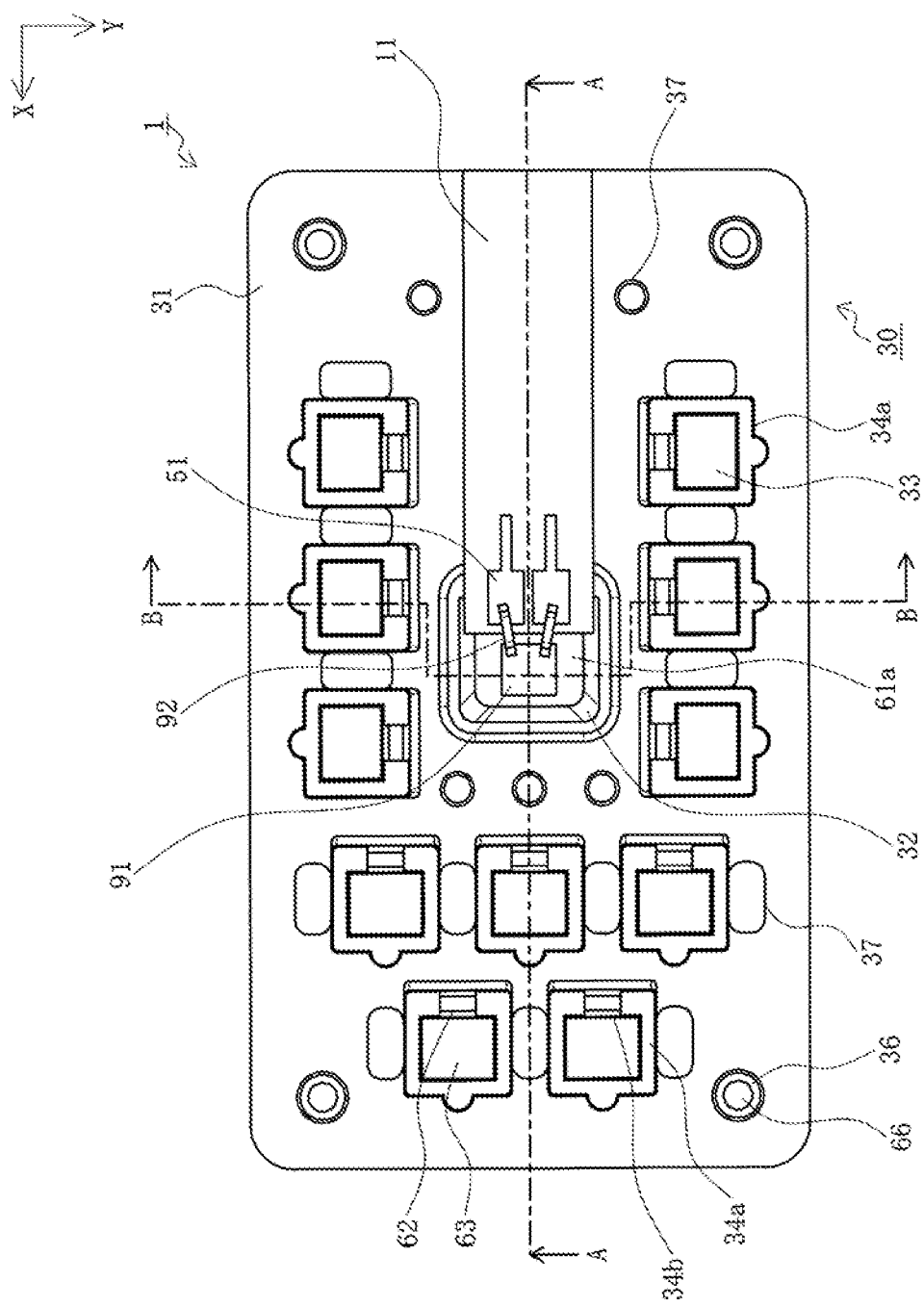
FIG. 3 is a top view of the electronic component module according to the present embodiment.
Figure 4:
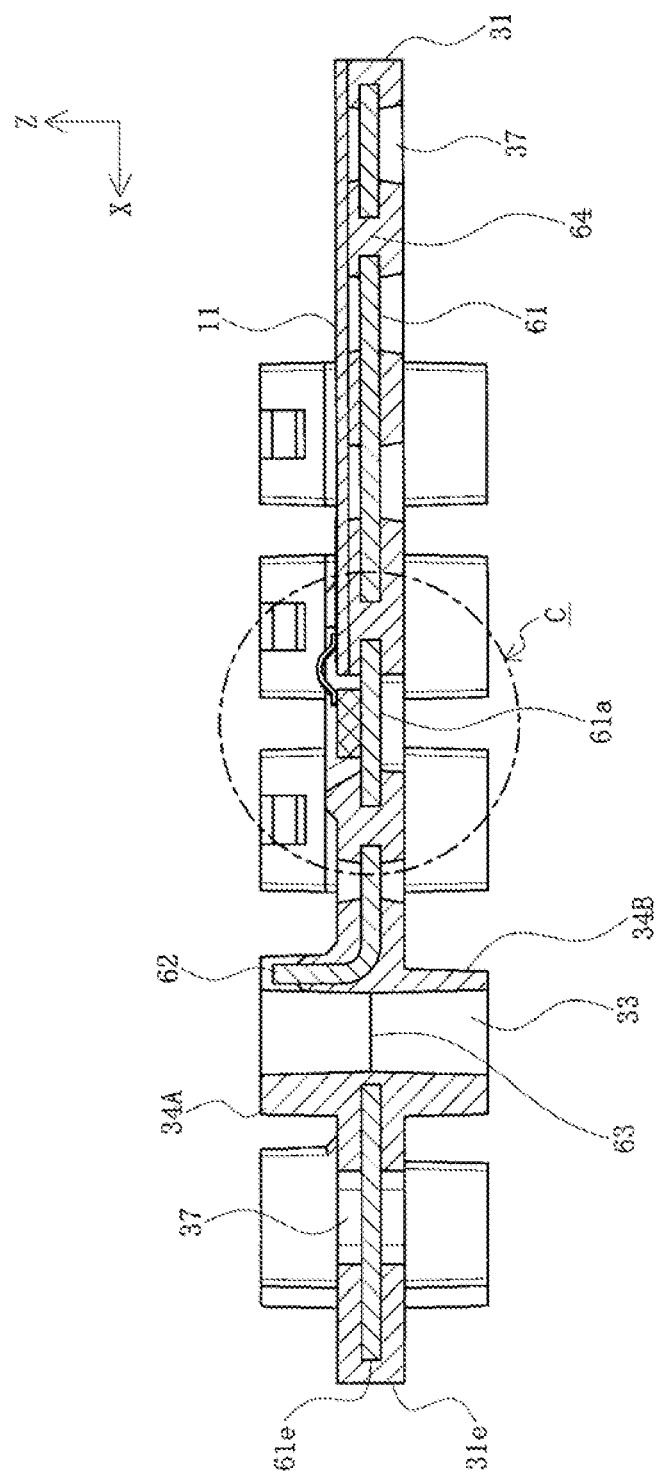
FIG. 4 is a side cross sectional view of the electronic component module according to the present embodiment, in the arrow direction taken along line A-A in FIG. 3.
Figure 5:
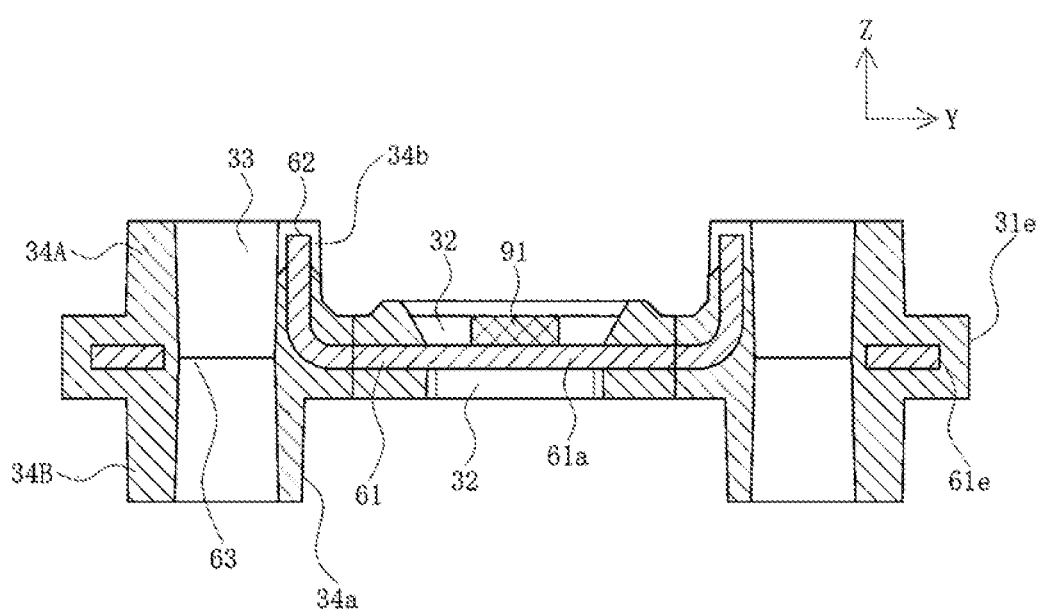
FIG. 5 is a transverse cross sectional view of the electronic component module according to the present embodiment, in the arrow direction taken along line A-A in FIG. 3.
Figure 6:
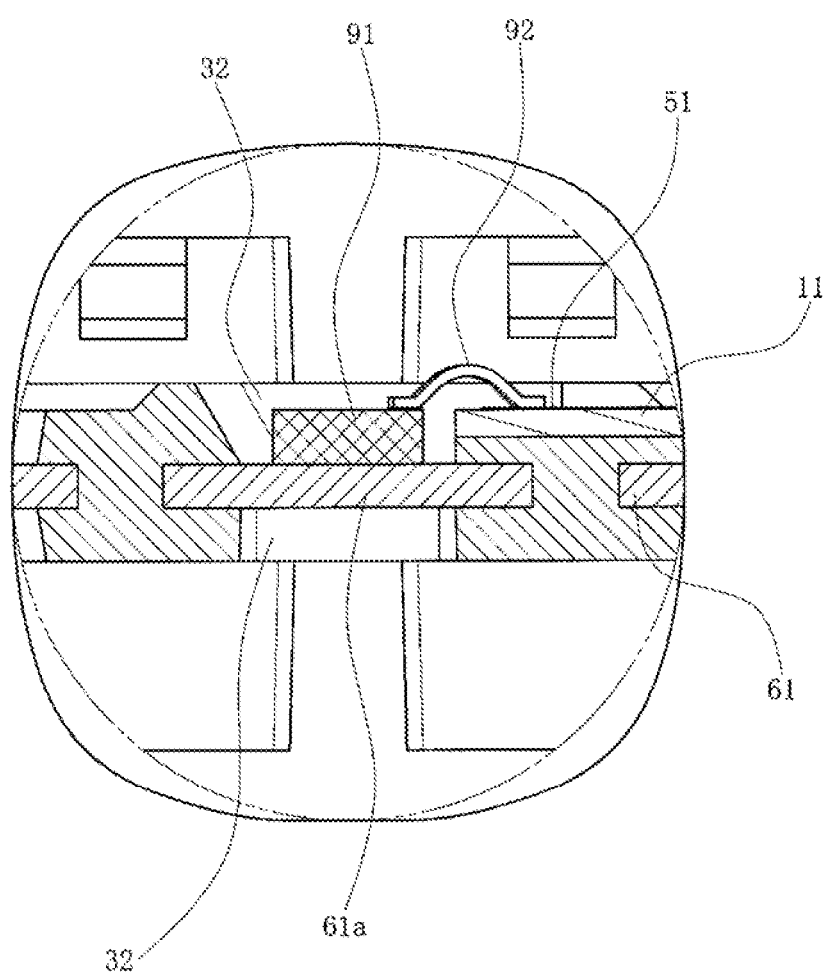
FIG. 6 is an enlarged cross sectional view of the main parts of the electronic component module according to the present embodiment and is an enlarged view of part C in FIG. 4.
Figure 7:
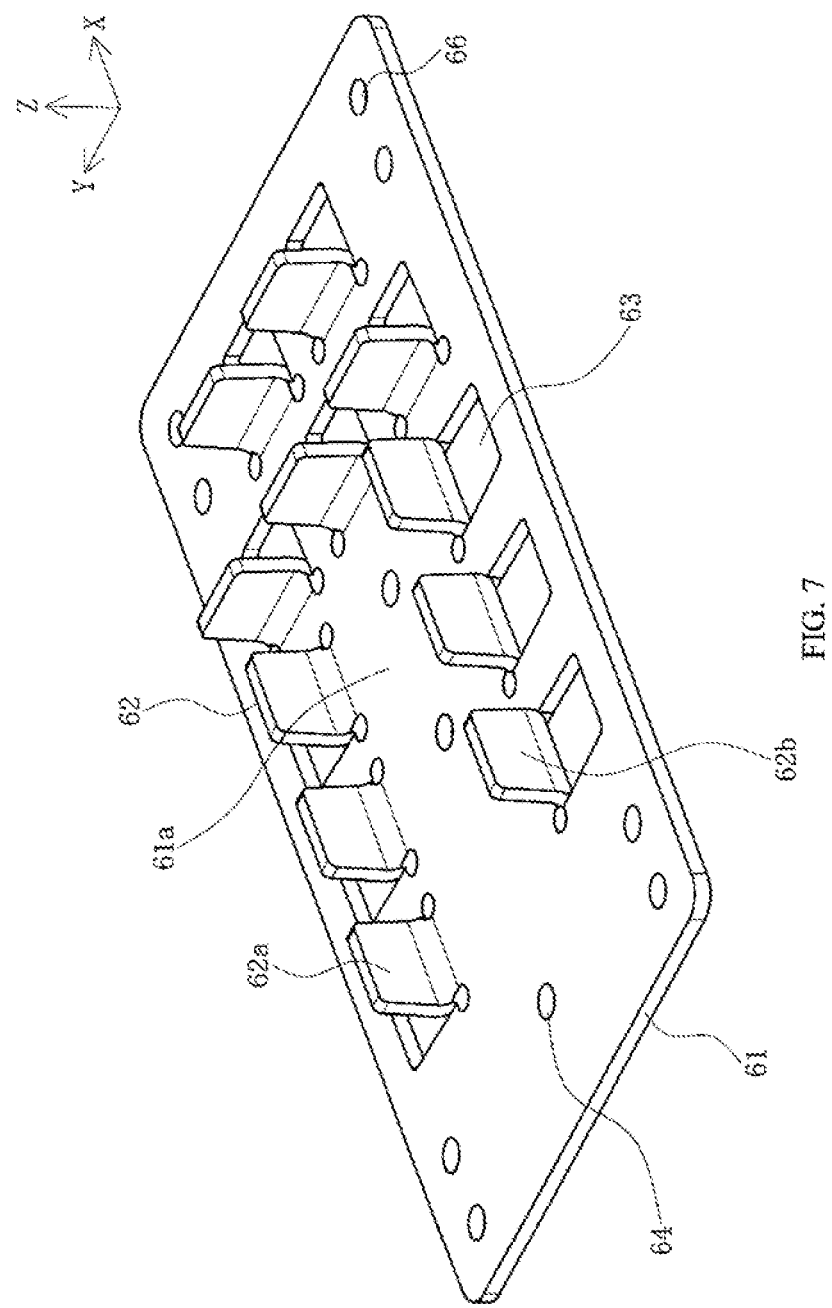
FIG. 7 is a perspective view as seen from the upper surface side of a thermally conductive plate of a heat radiator according to the present embodiment.
Figure 8:
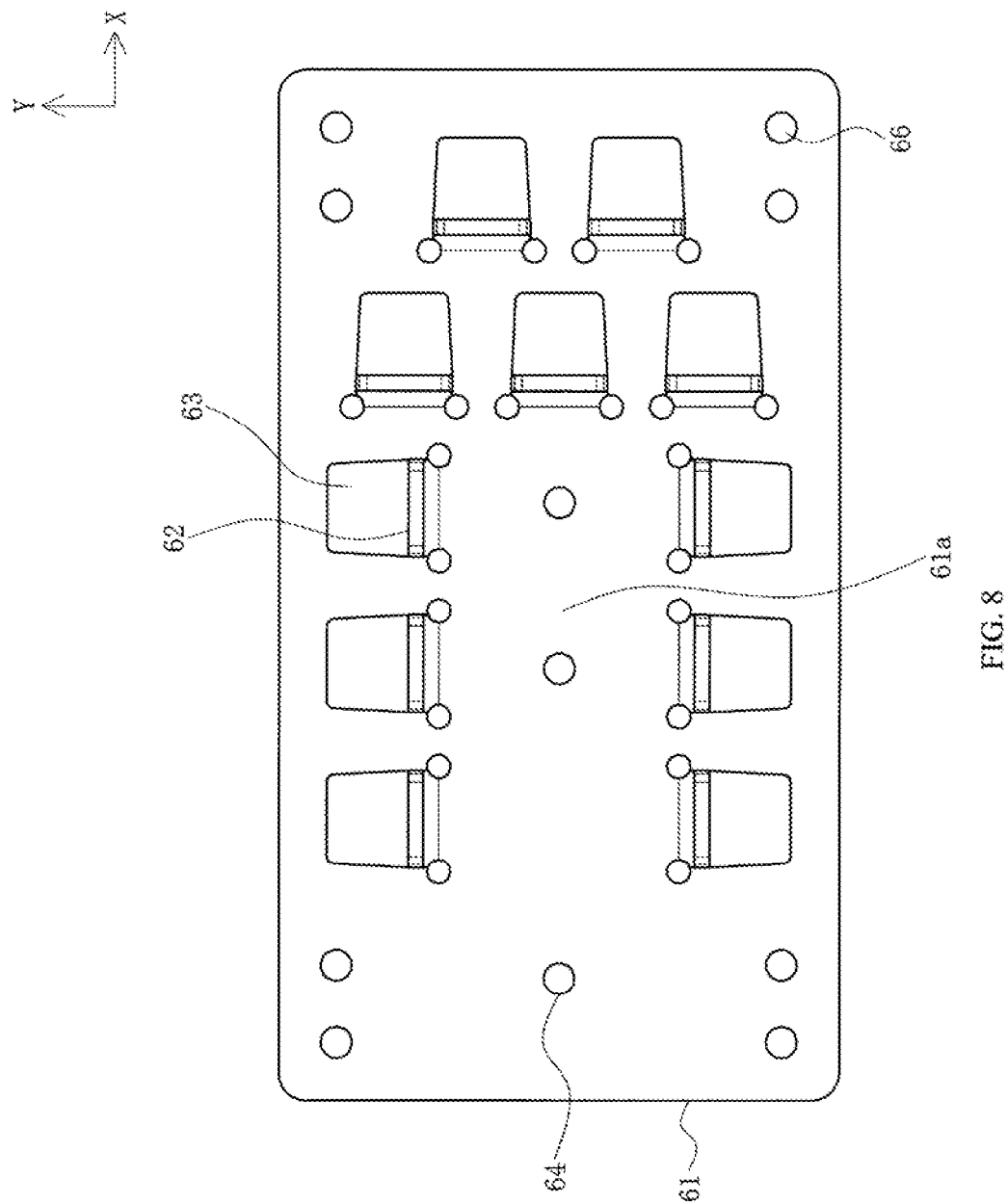
FIG. 8 is a top view of the thermally conductive plate of the heat radiator according to the present embodiment.

FIG. 1 is a perspective view as seen from the upper surface side of an electronic component module according to the present embodiment, FIG. 2 is an exploded view of the electronic component module according to the present embodiment, FIG. 3 is a top view of the electronic component module according to the present embodiment, FIG. 4 is a side cross sectional view of the electronic component module according to the present embodiment, in the arrow direction taken along line A-A in FIG. 3, FIG. 5 is a transverse cross sectional view of the electronic component module according to the present embodiment, in the arrow direction taken along line A-A in FIG. 3, FIG. 6 is an enlarged cross sectional view of the main parts of the electronic component module according to the present embodiment and is an enlarged view of part C in FIG. 4, FIG. 7 is a perspective view as seen from the upper surface side of a thermally conductive plate of a heat radiator according to the present embodiment, and FIG. 8 is a top view of the thermally conductive plate of the heat radiator according to the present embodiment.

In the drawing, 1 is an electronic component module according to the present embodiment and includes: a heating element 91 mounted thereon; and a heat radiator 30 for radiating heat generated by the heating element 91. The heating element 91 is an active electronic component such as, for example, an LSI and an LED, but is not limited thereto, with any type of member capable of being used as long as it is a member which generates heat during operation. Here, for convenience of description, the heating element 91 is described as an LED. Further, the heat radiator 30 includes: a metal plate 61 as a thermal conduction plate having a substantially rectangular plate shape; and a resin coating 31 integrated with the metal plate 61 so as to cover at least a portion of the surface of the metal plate 61.

Note that in the present embodiment, expressions indicating direction such as top, bottom, left, right, front, rear, and the like used to describe the configuration and operation of each part of the electronic component module 1, heating element 91, heat radiator 30, etc. are relative rather than absolute, and are appropriate when each part of the electronic component module 1, heating element 91, heat radiator 30, etc. are in the positions illustrated in the figures, but should be changed and interpreted according to changes in position with changes in posture.

In addition, the metal plate 61 is a member integrally formed by processing such as punching, bending, and cutting on a metal plate material having high thermal conductivity. As illustrated in FIGS. 7 and 8, the metal plate 61 is a flat plate shaped member having a substantially rectangular shape in a plan view, wherein the flat central part is a mounting part 61a on which the heating element 91 is attached and mounted. Moreover, multiple plate shaped cutting parts 62 each formed by cutting a portion of the metal plate 61, as well as multiple ventilation corresponding openings 63 which are through holes formed by cutting the cutting parts 62 and adjacent to the cutting parts 62, are disposed so as to surround at least a portion of the periphery of the mounting part 61a.

In the example illustrated in the drawing, each of the cutting parts 62 is formed such that a planar surface 62a thereof faces the mounting part 61a while a back surface 62b opposite the surface 62a faces the ventilation corresponding opening 63. Further, multiple resin passing ports 64, which are through holes smaller than the ventilation corresponding opening 63, are formed around the mounting part 61a and at other appropriate locations. Further, mounting member passing ports 66 through which a mounting member, such as a bolt and rivet for attaching the electronic component module 1 to a support plate (not illustrated) positioned below (Z-axis negative direction), passes are each formed at the four corners of the substantially rectangular metal plate 61.

Note that while the metal plate 61 suitably includes a metal having high thermal conductivity such as a copper alloy or an aluminum alloy, it is not limited thereto and may be any type of metal. Here, for convenience of description, the metal plate 61 is described as a copper plate having a plate thickness of approximately 0.8 [mm].

Note that while the metal plate 61 is exemplified as a thermally conductive plate, the present invention is not limited thereto and the metal plate 61 may be formed from a ceramic, etc. that has good electrical conductivity as long as the metal plate 61 can be configured in the present embodiment.

Moreover, the resin coating 31 is a member which is formed from an insulating resin such as a synthetic resin and integrally molded so as to integrate with the metal plate 61 by insert molding and is a thin coating with a thickness of approximately 1.0 [mm] covering substantially the entire upper and lower surfaces of the metal plate 61. Consequently, the outer shapes of the resin coating 31 and the heat radiator 30 are substantially rectangular flat plates in a plan view. Note that, as illustrated in FIG. 4, because a portion of the resin which forms the molded resin coating 31 passes through the resin passing port 64 of the metal plate 61 so as to connect the resin coating 31 covering the upper surface side (Z-axis positive direction side) of the metal plate 61 to the resin coating 31 covering the upper surface side (Z-axis negative direction side) thereof, the resin coating 31 and the metal plate 61 are firmly integrated and come into close contact with each other.

In addition, a mounting recess 32 is formed in a part corresponding to the mounting part 61a on the upper surface (Z-axis positive direction side surface) and the lower surface (Z-axis negative direction side surface) of the resin coating 31. The mounting recess 32 is a recess formed so as to be recessed from the upper surface and lower surface of the resin coating 31, with a mounting part 61a of the metal plate 61 exposed at the bottom of the recess. In addition, a heating element 91 is mounted on the upper surface of the mounting part 61a which is exposed in the mounting recess 32 on the upper surface side of the resin coating 31. For example, the lower surface of the heating element 91 is fixed to the upper surface of the mounting part 61a by a thermally conductive adhesive agent such as solder and a thermally conductive adhesive provided between the mounting part 61a and the heating element 91. Note that the mounting recess 32 on the lower surface of the resin coating 31 may be omitted as appropriate.

Moreover, as illustrated in FIG. 2, an electric circuit recess 35, which is a band shaped recess having one end connected to the mounting recess 32, is formed on the upper surface of the resin coating 31. The other end of the electric circuit recess 35 reaches one end in the longitudinal direction (X-axis direction) of the resin coating 31. In addition, a circuit board 11 having a conductive path, etc. for supplying a current to the heating element 91 is housed and affixed in the electric circuit recess 35. The circuit board 11 is, for example, a printed circuit board formed from a glass epoxy substrate having a copper foil attached to a plate such as FR-4, or a flexible printed circuit board such as an FPC board, but is not limited thereto, and may be any type. For example, it may be a molded interconnect device (MID) in which an electric circuit is plated on a plastic substrate, etc., or in some cases, a pattern may be formed directly on the resin coating 31 by resin plating. Here, for convenience of description, the circuit board 11 is described as a flexible printed circuit board.

As illustrated in FIGS. 1 to 3, multiple circuit side connection pads 51 are exposed on the upper surface of the circuit board 11, wherein multiple connection pads not illustrated and formed on the upper surface of the heating element 91, as well as the circuit side connection pads 51, are connected by bonding wires 92. As a result, a conductive path (not illustrated) connected to the circuit side connection pad 51 in the circuit board 11 is electrically connected to the heating element 91, with a current supplied to the heating element 91 via the circuit board 11.

Moreover, mounting member housing ports 36 through which a mounting member, such as a bolt and rivet for attaching the electronic component module 1 to a support plate (not illustrated) positioned below, can pass are each formed at the four corners of the substantially rectangular resin coating 31. Because each mounting member housing port 36 is formed in a position which is concentric with the mounting member passing port 66 of the metal plate 61, a mounting member (not illustrated) can pass through the mounting member housing port 36 of the resin coating 31 and the mounting member passing port 66 of the metal plate 61 which coincide with one another. Note that, as illustrated in FIG. 3, the diameter of the mounting member housing port 36 is preferably set so as to be larger than that of the mounting member passing port 66, allowing the mounting member housing port 36 to house a head with a larger diameter than that of the axis in the mounting member such as a bolt and rivet.

Multiple blind holes 37 are further formed at appropriate locations on the resin coating 31. In the examples illustrated in FIGS. 1 to 3, the blind holes 37 include oval and circular shapes, the inner diameters of which also include large and small holes. That is, the shape and size of each blind hole 37 can be optionally set. Note that each blind hole 37 is desirably formed so as to have the same shape and size at the same position in the resin coating 31 covering the upper surface side of the metal plate 61 and the resin coating 31 covering the lower surface side thereof. Moreover, the blind hole 37 does not penetrate from the upper surface to the lower surface of the resin coating 31, but is blocked by the metal plate 61 present between the upper surface and the lower surface of the resin coating 31. The blind hole 37 is configured so as to hold the metal plate 61 in a predetermined position within a cavity of a mold filled with resin when molding the resin film 31 integrally with the metal plate 61 by insert molding. Therefore, when the metal plate 61 is sandwiched between both upper and lower sides by a protrusion formed so as to protrude into the cavity, and when the filled resin is hardened and the molded resin film 31 is released from the mold, the blind hole 37 is a hole or recess formed by removing the protrusion and can be omitted as appropriate.

Further, multiple ventilation holes 33, which are through holes penetrating in the thickness direction, are formed in the resin coating 31. Each ventilation hole 33 is formed in a position coinciding with the position of the ventilation corresponding opening 63 of the metal plate 61 so as to penetrate through the metal plate 61 and the resin coating 31. However, the opening is smaller than that of the ventilation corresponding opening 63 and, as illustrated in FIG. 5, each ventilation hole 33 preferably passes through the respective ventilation corresponding opening 63. In other words, the metal plate 61 which defines the periphery of the ventilation corresponding opening 63 is preferably not exposed in the ventilation hole 33.

In addition, multiple ventilation cylinders 34 which define the periphery of each ventilation hole 33 and extend upward and downward are formed on the upper surface and lower surface of the resin coating 31. Multiple ventilation cylinders 34 are disposed so as to surround at least a portion of the periphery of the mounting recess 32 in a plan view. Here, a ventilation cylinder 34 extending upward from the upper surface of the resin film 31 is referred to as a first ventilation cylinder 34A, while a ventilation cylinder 34 extending downward from the lower surface of the resin film 31 is referred to as a second ventilation cylinder 34B. Note that the first ventilation cylinder 34A and the second ventilation cylinder 34B are collectively described as a ventilation cylinder 34.

In the example illustrated in the drawing, while the ventilation cylinder 34 is quadrangular cylindrical, it is not limited thereto and may be cylindrical, hexagonal cylindrical, or octagonal cylindrical, or a cylinder having any shape. Here, for convenience of description, the ventilation cylinder 34 is described as a quadrangular tubular cylinder. Moreover, in the example illustrated in the drawing, the ventilation cylinder 34 includes the first ventilation cylinder 34A and the second ventilation cylinder 34B. However, one of the ventilation cylinders 34 can be omitted as necessary. That is, only either one of the first ventilation cylinder 34A or the second ventilation cylinder 34B may be present.

Each of the first ventilation cylinders 34A includes four flat cylindrical walls 34a extending vertically upward from the upper surface of the resin coating 31, with each cylindrical wall 34a defining each of the four sides around the ventilation hole 33 having a rectangular cross section. Moreover, the upper ends of all of the first ventilation cylinders 34A are preferably flush with each other and parallel to the upper surface of the resin coating 31. In addition, at least a portion of the metal plate 61 is housed inside at least one cylindrical wall 34a. Specifically, in each of the first ventilation cylinders 34A, the cutting part 62 of the metal plate 61 is housed inside the mounting part 61a of the metal plate 61, that is, the cylindrical wall 34a facing the mounting recess 32 of the resin coating 31. In other words, the surface 62a and the back surface 62b on the flat surface of the cutting part 62, as well as the end edge of the cutting part 62, are covered by the resin forming the cylindrical wall 34a.

Note that at least a portion of the cutting part 62 needs to be housed inside the cylindrical wall 34a. For example, in the example illustrated in the drawing, while the cutting part 62 is cut to an angle of approximately 90 degrees relative to the upper surface of the metal plate 61, it may be cut at a smaller angle and angled relative to the upper surface of the metal plate 61. In this case, a portion of the back surface 62b of the cutting part 62 can be exposed or protruded into the ventilation hole 33. Further, in the example illustrated in the drawing, while the cutting part 62 is cut such that the tip thereof faces upward, the cutting part 62 may be cut such that the tip thereof faces downward. In this case, the cutting part 62 may be housed inside the cylindrical wall 34a of the second ventilation cylinder 34B rather than the first ventilation cylinder 34A.

Further, in the example illustrated in the drawing, the cylindrical wall 34a facing the mounting recess 32 of the resin coating 31 includes a missing part 34b extending downward from the upper end, wherein a portion near the upper end of the cutting part 62 is exposed to the missing part 34b. The missing part 34b is configured so as to hold the metal plate 61 in a predetermined position within a cavity of a mold filled with resin when molding the resin film 31 integrally with the metal plate 61 by insert molding. Therefore, when the cutting part 62 is pressed down by a protrusion formed so as to protrude into the cavity, and when the filled resin is hardened and the molded resin film 31 is released from the mold, the missing part 34b is a missing part of the resin formed by removing the protrusion and can be omitted as appropriate.

In the present embodiment, all parts of the metal plate 61 are covered by the resin coating 31, except the mounting recess 32, the mounting member housing port 36, the blind hole 37, and the parts exposed to the missing part 34b. In other words, all parts including the end edge 61e are covered by the resin coating 31, except very narrow parts essential to manufacturing and operations, such as parts required to manufacture the heat radiator 30, parts required in operations for mounting the heating element 91 to the heat radiator 30, and parts required for attaching the heat radiator 30 to the support plate. Moreover, the metal plate 61 embedded in the resin coating 31 reaches the position at which the end edge 61e thereof is close to the end edge 31e of the resin coating 31. In other words, in a plan view, the metal plate 61 is embedded throughout nearly all parts of the resin coating 31.

Generally, the metal has high thermal conductivity but low emissivity, whereas the resin has low thermal conductivity but high emissivity. Consequently, as in the heat radiator 30 according to the present embodiment, when all parts of the metal plate 61 except very narrow parts essential to manufacturing and operations are covered by the thin resin coating 31, and when the metal plate 61 is present in nearly all parts of the resin coating 31, heat generated by the heating element 91 conducts a metal plate 61 having high thermal conductivity and is rapidly transmitted to all parts of every corner of the metal plate 61, after which, from the metal plate 61, it conducts the resin coating 31 which has a low thermal conductivity but is thinly formed, is rapidly transmitted to the surfaces of all parts of the resin coating 31, and is rapidly radiated to the external environment by radiation (emission) from the surfaces of all parts of the resin coating 31 having high emissivity.

Further, the heat radiator 30 according to the present embodiment has multiple ventilation cylinders 34 which extend in the vertical direction so as to pass through the metal plate 61 and the resin coating 31. Consequently, the surrounding air rises rapidly inside the ventilation hole 33 by the so-called chimney effect, causing the air convection to rapidly radiate heat from the inner circumferential surface of the ventilation holes 33 and the surface of the resin coating 31 around the ventilation cylinder 34. Moreover, because multiple ventilation cylinders 34 are formed, the surface area of the resin coating 31 increases and radiation as well as air convection rapidly radiate heat from a wide surface of the resin coating 31.

Further, for example, when the electronic component module 1 is attached to a support plate (not illustrated) positioned below, the space between the lower surface of the resin coating 31 and the support plate has low flowability of air, readily confining heat therein. However, because air in the space flows in the ventilation hole 33 from the lower end of the ventilation hole 33 and rises rapidly, air convection rapidly radiates heat in the space. Further, because the cutting part 62 of the metal plate 61 is housed inside the cylindrical wall 34a, heat generated by the heating element 91 conducts the cutting part 62 and is rapidly transmitted to the cylindrical wall 34a, then rapidly radiated by the air flowing in the ventilation hole 33.

Note that the abovementioned cutting part 62 is formed such that the metal plate 61 is cut such that one side of the ventilation corresponding opening 63 connects. However, the configuration of the metal plate 61 which protrudes from the front surface 62a or the opposing back surface 62b is not limited thereto and may be a configuration in which the metal plate 61 is raised and cut from the opposing side of the ventilation corresponding opening 63, or is raised from the entire circumference of the ventilation corresponding opening 63 by pressing, etc. In other words, it needs to have a configuration formed along the periphery of the ventilation corresponding opening 63.

Next, the configuration of the lower surface side of the electronic component module 1 will be described in detail.

Figure 9:
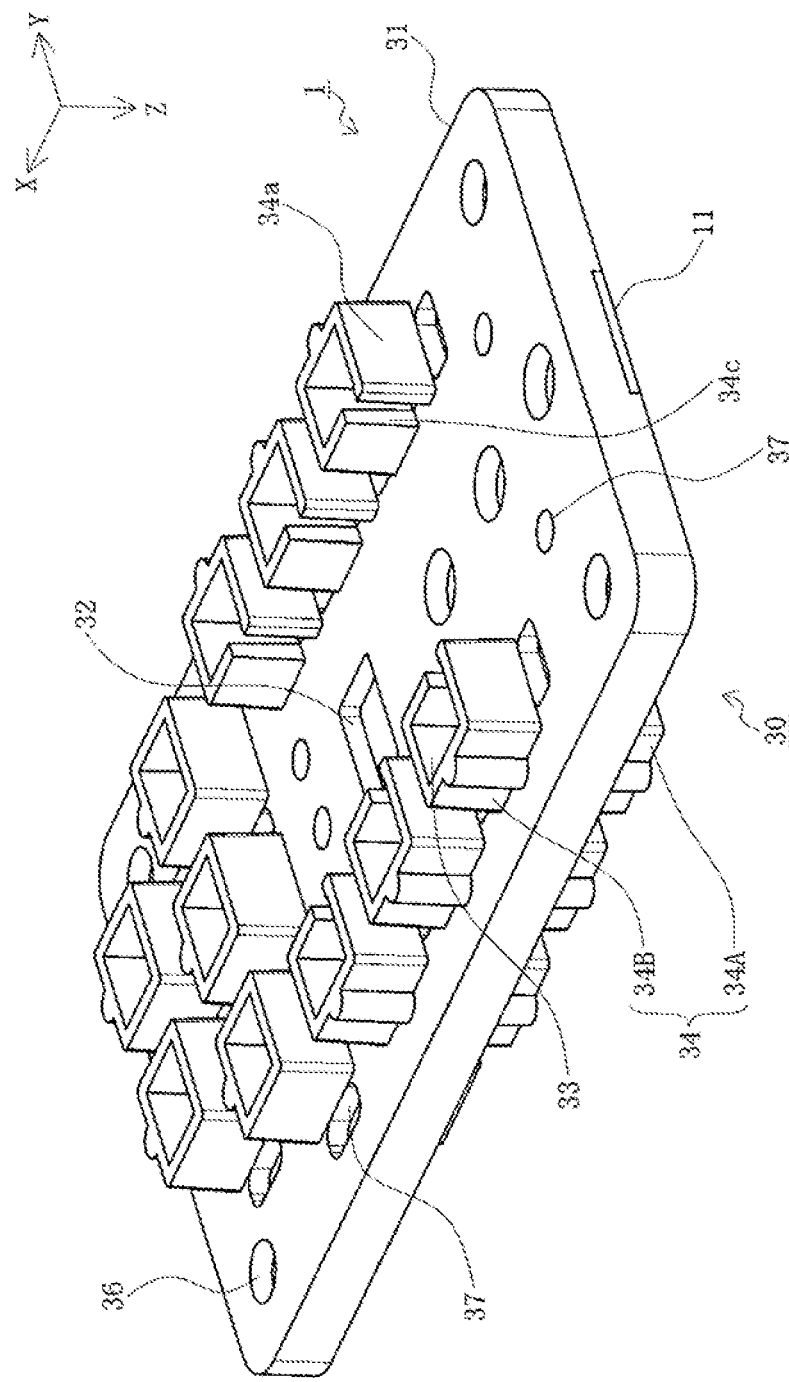
FIG. 9 is a perspective view as seen from the lower surface side of the electronic component module according to the present embodiment.
Figure 10:
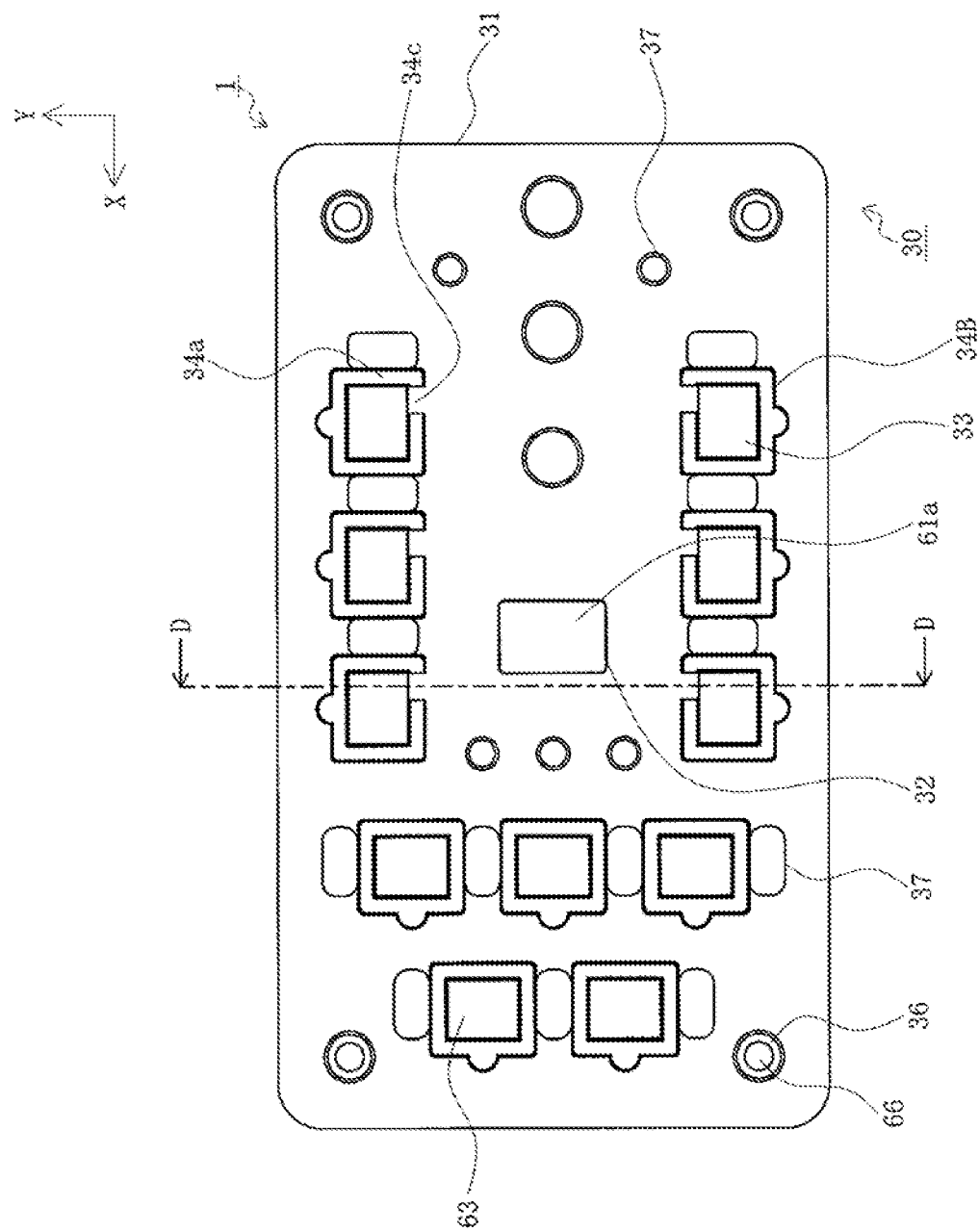
FIG. 10 is a bottom view of the electronic component module according to the present embodiment.
Figure 11:
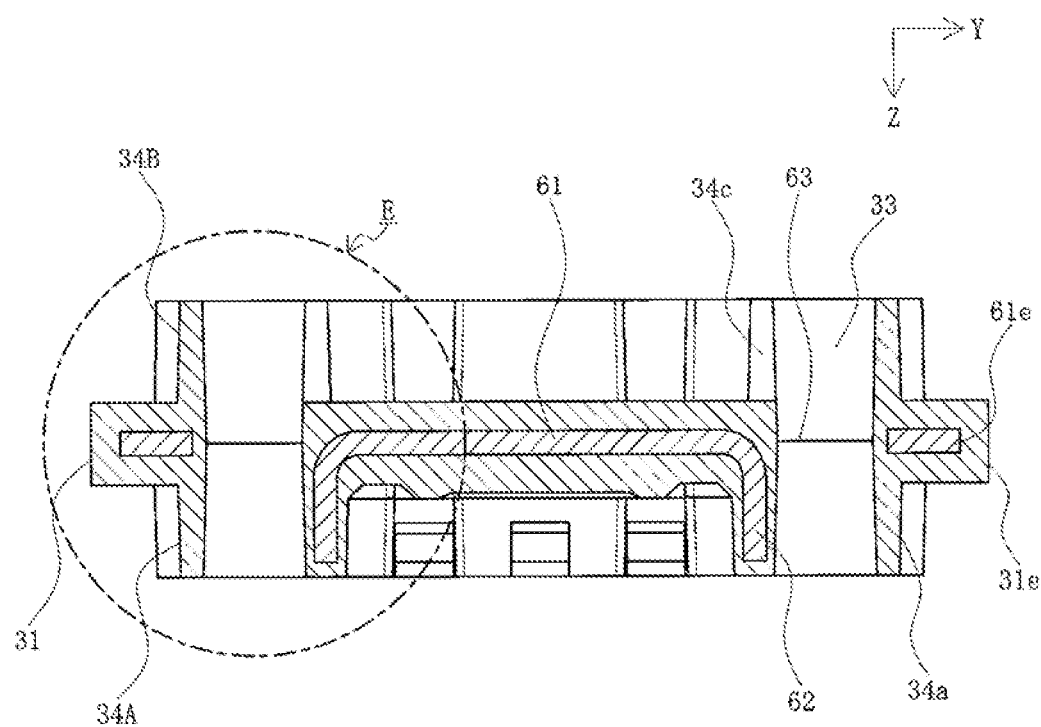
FIG. 11 is a cross sectional view of the electronic component module according to the present embodiment, in the arrow direction taken along line D-D in FIG. 10.
Figure 12:
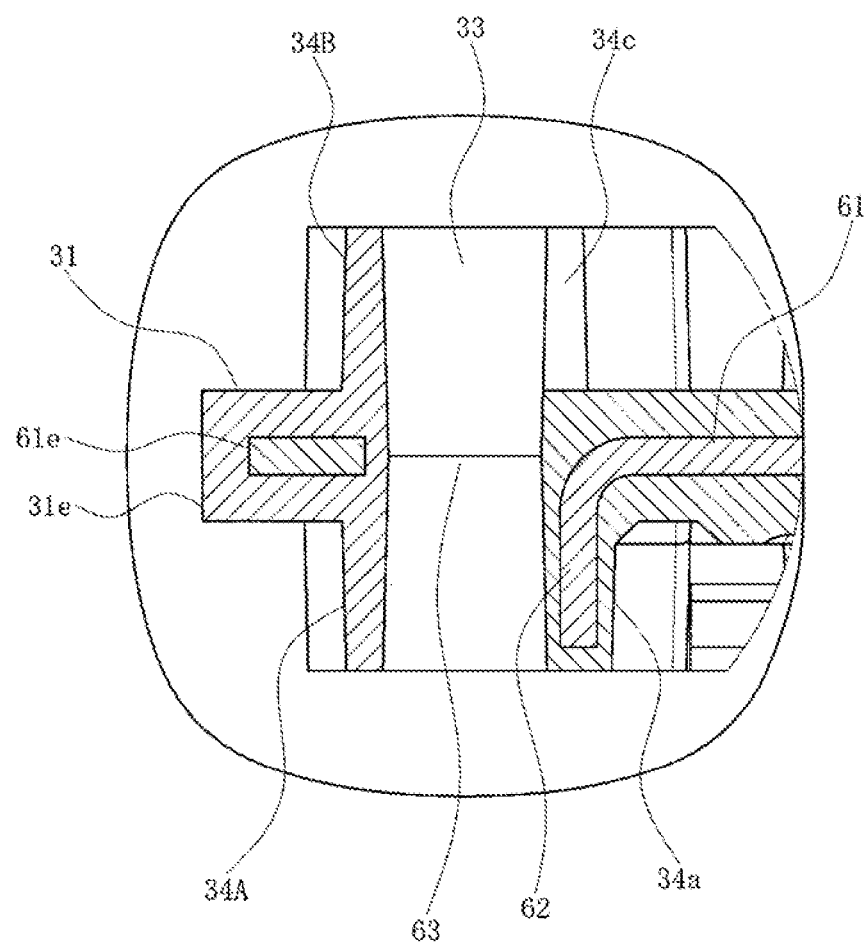
FIG. 12 is an enlarged cross sectional view of the main parts of the electronic component module according to the present embodiment and is an enlarged view of part E in FIG. 11.
Figure 13:
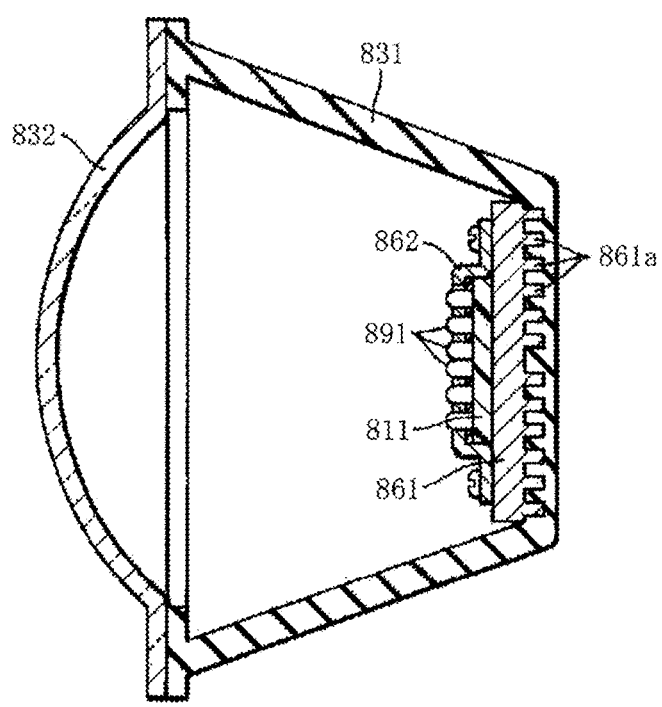
FIG. 13 is a cross sectional view illustrating an electronic component module on which a conventional heat generating component is mounted.

FIG. 9 is a perspective view as seen from the lower surface side of the electronic component module according to the present embodiment, FIG. 10 is a bottom view of the electronic component module according to the present embodiment, FIG. 11 is a cross sectional view of the electronic component module according to the present embodiment, in the arrow direction taken along line D-D in FIG. 10, and FIG. 12 is an enlarged cross sectional view of the main parts of the electronic component module according to the present embodiment and is an enlarged view of part E in FIG. 11.

In the example illustrated in the drawing, although the mounting recess 32 is formed on the lower surface (Z-axis negative direction side surface) of the resin coating 31, the electric circuit recess 35 is not formed thereon. Consequently, the circuit board 11 is not affixed to the lower surface of the resin coating 31 and no heating element 91 is mounted on the lower surface of the mounting part 61a exposed in the mounting recess 32. However, the mounting member housing port 36, the blind hole 37, and the ventilation hole 33 are formed on the lower surface of the resin coating 31, similar to the upper surface thereof. Further, a second ventilation cylinder 34B is formed so as to define the periphery of each ventilation hole 33 and extend downward (in the negative Z-direction).

Each of the second ventilation cylinders 34b includes four flat cylindrical walls 34a extending vertically downward from the lower surface of the resin coating 31, with each cylindrical wall 34a defining each of the four sides around a ventilation hole 33 having a rectangular cross section. Moreover, the lower ends of all of the second ventilation cylinders 34B are preferably flush with each other and parallel to the lower surface of the resin coating 31. Note that in all of the second ventilation cylinders 34B, the cutting part 62 of the metal plate 61 is not housed inside the cylindrical wall 34a. Further, in some second ventilation cylinders 34b, the cylindrical wall 34a facing the mounting recess 32 of the resin coating 31 includes a slit shaped wall opening 34c extending from the lower end to the lower surface of the resin coating 31. Regarding the ventilation hole 33 in the second ventilation cylinder 34B including the wall openings 34c, not only the lower end of the second ventilation cylinder 34B but also the wall openings 34c open on the lower surface side of the resin coating 31. Therefore, when the so-called chimney effect allows the surrounding air to rapidly rise inside the ventilation hole 33, air flows in the ventilation hole 33 through the lower end of the second ventilation cylinder 34B and the wall opening 34c.

Consequently, a large amount of air is rapidly introduced into the ventilation hole 33 from the periphery and rises in the ventilation hole 33, causing air convection to rapidly radiate a large amount of heat from the inner circumferential surface of the ventilation holes 33 and the surface of the resin coating 31 around the ventilation cylinder 34. For example, when the electronic component module 1 is attached to a support plate (not illustrated) positioned below and the lower end of the second ventilation cylinder 34B is brought into contact with or brought closer to the support plate, it is impossible or difficult for air to flow in the ventilation holes 33 through the lower end of the second ventilation cylinder 34B. However, even in such a case, a sufficient amount of air can flow in the ventilation hole 33 through the wall opening 34c and rise inside the ventilation hole 33.

As described above, in the present embodiment, the heat radiator 30 includes: a metal plate 61; and a resin coating 31 integrated with the metal plate 61 so as to cover at least a portion of the surface of the metal plate 61. In addition, the resin coating 31 includes a ventilation cylinder 34 through which ventilation holes 33 passing through the metal plate 61 and the resin coating 31 pass, wherein at least a portion of the metal plate 61 is housed inside the cylindrical wall 34a of the ventilation cylinder 34. As a result, the heat radiator 30 has a simple configuration and high heat radiation, enabling effective heat radiation and preventing excessive temperature increases so as to improve reliability.

In addition, the metal plate 61 includes the cutting part 62, wherein at least a portion of the cutting part 62 is housed inside the cylindrical wall 34a. Consequently, heat conducts the cutting part 62 and is rapidly transmitted to the cylindrical wall 34a before being rapidly radiated by the air rising inside the ventilation hole 33 by the so-called chimney effect.

Further, the metal plate 61 includes a ventilation corresponding opening 63 which is a through hole generated by cutting the cutting part 62 and is adjacent to the cutting part 62, with the ventilation hole 33 passing through the ventilation corresponding opening 63. As a result, the cutting part 62 can be brought closer to the ventilation hole 33, allowing heat to be rapidly transmitted from the cutting part 62 through the cylindrical wall 34a to the inner circumferential surface of the ventilation hole 33 and rapidly radiated by the air rising inside the ventilation hole 33.

Further, the ventilation cylinder 34 extends upward and downward from the upper surface and lower surface of the resin coating 31. As a result, the surface area of the resin coating 31 increases, allowing heat to be rapidly radiated from the surface of the resin coating 31, while the ventilation holes 33 become longer, also increasing the chimney effect.

Further, at least a portion of the metal plate 61 is housed inside the cylindrical wall 34a of the ventilation cylinder 34 extending upward from the upper surface of the resin coating 31, with a slit shaped wall opening 34c formed on the cylindrical wall 34a of the ventilation cylinder 34 extending downward from the lower surface of the resin coating 31. Consequently, even when it is impossible or difficult to flow in the ventilation hole 33 through the lower end of the ventilation cylinder 34 in which air extends downward, a sufficient amount of air can flow in the ventilation hole 33 through the wall opening 34c and rise inside the ventilation hole 33.

In addition, in the present embodiment, the electronic module 1 includes: a metal plate 61; a resin coating 31 integrated with the metal plate 61 so as to cover at least a portion of the surface of the metal plate 61; and a heating element 91, which is an electronic component mounted on the flat mounting part 61a of the metal plate 61. The resin coating 31 includes: a mounting recess 32 formed such that the mounting part 61a is exposed; and a ventilation cylinder 34 through which ventilation holes 33 passing through the metal plate 61 and the resin coating 31 pass, wherein at least a portion of the metal plate 61 is housed inside the cylindrical wall 34a of the ventilation cylinder 34. As a result, the heat radiator 1 has a simple configuration and high heat radiation, enabling effective radiation of heat generated by the heating element 91 and preventing excessive temperature increases so as to improve reliability.

Further, the present invention further includes a circuit board 11 including a conductive path connected to the heating element 91, wherein the resin coating 31 includes an electric circuit recess 35 having one end connected to the mounting recess 32 and housing the circuit board 11. Consequently, the electrical connection operation of the heating element 91 can be easily performed.

Further, there are a plurality of ventilation cylinders 34 disposed so as to surround at least a portion of the periphery of the mounting recess 32 in a plan view. Consequently, the air rising inside the surrounding ventilation hole 33 can rapidly radiate the heat generated by the heating element 91.

Further, the metal plate 61 includes the cutting part 62, wherein the cutting part 62 is formed such that a planar surface 62a faces the mounting recess 32. Consequently, heat generated by the heating element 91 can be rapidly transmitted to the cylindrical wall 34a of the ventilation cylinder 34 via the cutting part 62 to radiate the heat.

Note that the disclosure herein describes features relating to suitable exemplary embodiments. Various other embodiments, modifications, and variations within the scope and spirit of the claims appended hereto will naturally be conceived of by those skilled in the art upon review of the disclosure herein.

The present disclosure can be applied to a heat radiator and an electronic component module.

The invention claimed is:

1. A heat radiator, comprising:
 a thermally conductive plate with a surface; and
 a resin coating integrated with the thermally conductive plate configured to cover at least a portion of the surface of the thermally conductive plate,
 wherein the resin coating includes a ventilation cylinder through which ventilation holes passing through the thermally conductive plate and the resin coating, and wherein at least a portion of the thermally conductive plate is housed inside a cylindrical wall of the ventilation cylinder and extends upward from the surface of the thermally conductive plate.

2. The heat radiator according to claim 1, wherein the thermally conductive plate includes a cutting part and at least a portion of the cutting part is housed inside the cylindrical wall.

3. The heat radiator according to claim 2, wherein the thermally conductive plate includes a ventilation corresponding opening which is a through hole generated by cutting the cutting part and is adjacent to the cutting part, and wherein the ventilation hole passes through the ventilation corresponding opening.

4. The heat radiator according to claim 1, wherein the resin coating includes an upper surface and a lower surface and the ventilation cylinder extends upward and downward from the upper surface and the lower surface of the resin coating.

5. The heat radiator according to claim 4, wherein at least a portion of the thermally conductive plate is housed inside the cylindrical wall of the ventilation cylinder extending upward from the upper surface of the resin coating, and wherein a slit shaped wall opening is formed on the cylindrical wall of the ventilation cylinder extending downward from the lower surface of the resin coating.

6. An electronic component module, comprising:
 a thermally conductive plate with a surface;
 a resin coating integrated with the thermally conductive plate, the resin coating covering at least a portion of the surface of the thermally conductive plate; and
 an electronic component mounted on a flat mounting part of the thermally conductive plate,
 wherein the resin coating includes: a mounting recess formed exposing the mounting part; and a ventilation cylinder through which ventilation holes passing through the thermally conductive plate and the resin coating, and wherein at least a portion of the thermally conductive plate is housed inside a cylindrical wall of the ventilation cylinder and extends upward from the surface of the thermally conductive plate.

7. The electronic component module according to claim 6, further comprising a circuit board including a conductive path connected to the electronic component, wherein the resin coating houses the circuit board, and one end of the circuit board is connected to the mounting recess.

8. The electronic component module according to claim 7, wherein there are a plurality of ventilation cylinders disposed to surround at least a portion of a periphery of the mounting recess in a plan view.

9. The electronic component module according to claim 6, wherein the thermally conductive plate includes a cutting part and the cutting part is formed with a planar surface that faces the mounting recess.

* * * * *